(12) United States Patent
Wielage et al.

(10) Patent No.: US 7,839,168 B2
(45) Date of Patent: Nov. 23, 2010

(54) CIRCUIT WITH PARALLEL FUNCTIONAL CIRCUITS WITH MULTI-PHASE CONTROL INPUTS

(75) Inventors: Paul Wielage, Waalre (NL); Martinus T. Bennebroek, Den Bosch (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/518,696

(22) PCT Filed: Dec. 10, 2007

(86) PCT No.: PCT/IB2007/055003

§ 371 (c)(1), (2), (4) Date: Jun. 11, 2009

(87) PCT Pub. No.: WO2008/072173

PCT Pub. Date: Jun. 19, 2008

(65) Prior Publication Data

US 2009/0267670 A1    Oct. 29, 2009

(30) Foreign Application Priority Data

Dec. 12, 2006    (EP)    .................... 06125966

(51) Int. Cl.
*H03K 19/173* (2006.01)
(52) U.S. Cl. ............................. 326/46; 326/38; 326/93
(58) Field of Classification Search ............. 326/37–41, 326/46, 93–98
See application file for complete search history.

(56) References Cited

U.S. PATENT DOCUMENTS

| 3,757,231 | A   | 9/1973  | Faustini          |         |
|-----------|-----|---------|-------------------|---------|
| 3,953,838 | A   | 4/1976  | Gilbert et al.    |         |
| 4,857,906 | A * | 8/1989  | Conner            | 345/97  |
| 5,463,340 | A   | 10/1995 | Takabatake et al. |         |
| 6,356,117 | B1  | 3/2002  | Sutherland et al. |         |
| 6,989,824 | B1* | 1/2006  | Ishii et al.      | 345/204 |
| 2003/0108139 | A1 | 6/2003 | Jung |         |

FOREIGN PATENT DOCUMENTS

EP    1096506 A1    5/2001
JP    2002006791 A    1/2002

* cited by examiner

*Primary Examiner*—Don P Le

(57) ABSTRACT

A circuit has a plurality of functional circuits (100*a-f*), each with multiphase control inputs. A control circuit drives the inputs for each phase in parallel. The control circuit (120*a-c*) comprises a chain of one-shot circuits (120*a-c*), each comprising a bi-stable circuit (121). The bi-stable circuit (121) of a first one-shot circuit in the chain has a set input coupled to the basic control signal input (126), the bi-stable circuits (121) of a remaining or each remaining one-shot circuit (120*a-c*) in the chain have a set input output of its predecessor in the chain. Each bi-stable circuit (121) has an output coupled to a respective one of the multiphase control outputs (14*a-c*) and a reset input coupled to the respective one of the multiphase control outputs (14*a-c*). Loading of the multiphase control outputs (14*a-c*) by the functional circuits results in a delay of the reset. Thus the pulse durations of the one shot circuits are adapted to the number of functional circuits to ensure sufficient signal development.

8 Claims, 5 Drawing Sheets

CIRCUIT WITH PARALLEL FUNCTIONAL CIRCUITS WITH MULTI-PHASE CONTROL INPUTS

FIELD OF THE INVENTION

The invention relates to a circuit that comprises parallel functional circuits that each requires multi-phase control signals.

BACKGROUND OF THE INVENTION

U.S. Pat. No. 5,463,340 discloses a shift register comprising a chain of master-slave stages. In operation clock signals are provided first to copy data between stages and next to copy data within the stages from a master flip-flop to a slave flip-flop that supplies the data to the output of the stage. Thus, data in the slave flip-flops is always overwritten only after it has been copied to the master flip-flop of the next stage.

U.S. Pat. No. 5,463,340 uses four control signals derived from a clock signal to control each shift register stage, two for the master flip-flop and two for the slave flip-flops. In each flip-flop, the control signals control a pass and a hold function respectively. The four control signals are generated by applying the clock signal to a chain of inverters and using control signals from the outputs of respective ones of the inverters.

However, such a way of generating control signals may not be reliable if a large number of shift register stages has to be controlled. The effectiveness of the control signal may depend on the data in the stages.

SUMMARY OF THE INVENTION

Among others, it is an object to provide a circuit wherein multiphase control circuit are supplied in a more reliable way.

A circuit according to claim 1 is provided. Herein a chain of one-shot circuits is used to generate a set of multiphase control signals for each of a plurality of functional circuits. In an embodiment each functional circuit comprises a shift register chain, comprising shift register stages with respective shift control inputs coupled to the respective ones of the multiphase control outputs. In a further embodiment the shift register chains each comprise at least three shift register stages, the shift control inputs of shift register stages that are located successively more downstream in the shift register chain being coupled to the outputs of the one-shot circuits that are located successively more upstream in the chain of one shot circuits.

Each one shot circuit in the chain of one shot circuits comprises a bi-stable circuit that defines the multiphase control signal from the one shot circuit. The bi-stable circuits have reset inputs coupled to the multiphase control outputs. Thus, pulses on the multiphase control outputs are terminated only after the pulses have developed a sufficient logic level change to control functional circuits. Slow development of the pulses due to loading by a large number of functional circuits does not prevent effective pulses to be generated.

In an embodiment the circuit comprises a plurality of data sampling circuits with outputs coupled to data inputs of respective ones of the functional circuits. The data sampling circuits having sampling control inputs coupled to the basic control signal input and not to the chain of one-shot circuits. Thus, up-front data sampling is not affected by delays due to the one shot circuits. In a further embodiment each functional circuit comprises a shift register chain. In this case after up-front sampling shifting may be activated in the shift register chain starting from a downstream shift register stage and activating successively more upstream shift register stages until the shift register stage after the sampling stage is reached.

In an embodiment the control circuit comprises a further bi-stable circuit to control the sampling stages to make them follow input data after the first shift register stage after the sampling stage has captured data from the sampling stage. This makes it possible to reduce constraints imposed on the basic control signal.

In a further embodiment the control circuit enables the sampling stage to start following input data after the pulses have reached the end of the chain of one shot circuits, and after the basic control signal has signaled an end of a hold period. This increased sampling response speed with little or no constraints on the basic control signal.

BRIEF DESCRIPTION OF THE FIGURES

These and other objects and aspects will become apparent from a description of exemplary embodiments, using the following figures.

DETAILED DESCRIPTION OF EXEMPLARY EMBODIMENTS

Figure 1:
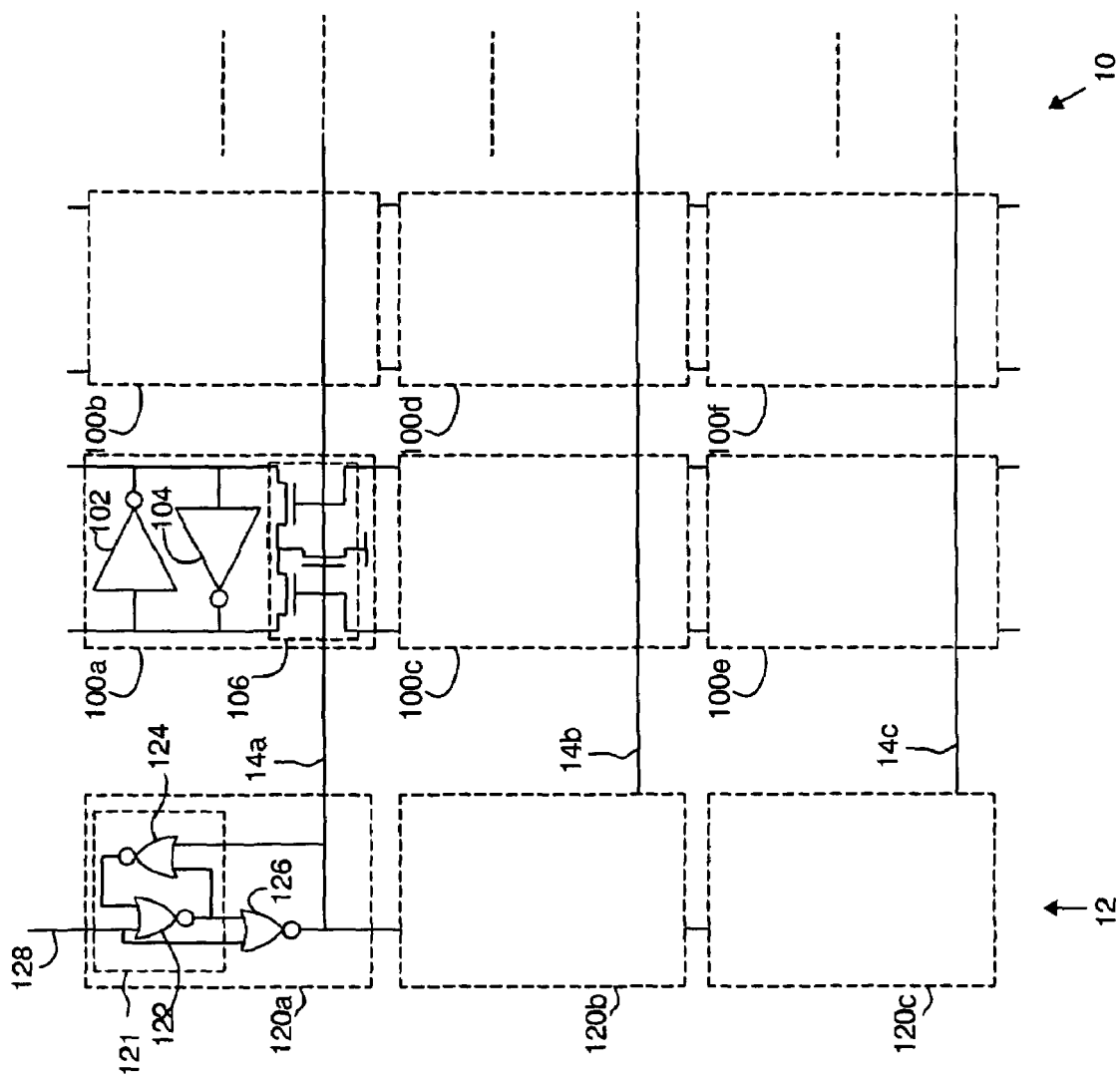
FIG. 1 shows a shift register with a first control circuit

FIG. 1 shows a shift register 10 with a control circuit 12 and shift control lines 14a-c. Shift register 10 comprises a chain of shift register stages 100a-f. Details of only one shift register stage 100a are shown. The others may be similar. Shift register stage 100a comprises a pair of cross coupled inverters 102, 104 and a write circuit 106 with data inputs coupled to a preceding shift register stage 100a-f and a write hold control input. The shift register circuits are coupled in chains 100a, c,e, 100b,d,f, outputs of shift register stages that are located upstream in the chain being connected successively to shift register stages that are located downstream in the chain. Additionally shift register stages 100a-f may contain output buffer circuits, such as an inverter, coupled to the output of one of the inverters 102, 104.

In an embodiment the shift register is part of a Programmable Logic Device, the shift register stages being used to supply configuration signals to configurable circuits such as multiplexers or programmable logic circuits.

The shift register stages 100a-f are divided into groups in which the hold control inputs are coupled to each other via respective ones of the shift control lines 14a-c. Preferably the shift register stages 100a-f are arranged in an integrated circuit in a matrix layout with rows and columns of shift register stages, each row defining a respective group of shift register stages 100a-f wherein the hold control inputs are coupled to each other. In the figure two columns and three rows are shown, but it should be appreciated that a larger number of rows or columns may be used. The control circuit 12 provides for use of a large number of columns, e.g. at least eight columns or at least thirty-two columns.

Control circuit 12 comprises an input 128 and a chain of one-shot circuits 120a-c. Only one of the one-shot circuits 120a is shown in detail. The other one shot circuits 120b, 120c are identical to this one-shot circuit 120a. One shot circuit 120a comprises a set/reset latch 121 and a feedback NOR gate 126. The a set/reset latch 121 is an example of a bi-stable circuit. In the embodiment shown in the figure latch 121 is formed by first NOR gate 122 and second NOR gates 124, which are cross-coupled, first and second NOR gate 122, 124 each having a first input cross-coupled to the output of the second and first NOR gate 124, 122 respectively. A second input of first NOR gate 122 is coupled to an input of the one-shot circuit 120a.

Feedback NOR gate 126 has inputs coupled to the input of the one-shot circuit 120a and an output of first NOR gate 122. From each one-shot circuit 120a-c an output of feedback NOR gate 126 is coupled to the hold control inputs of a respective group of shift register stages 100a-f via a respective shift control line 14a-c. Furthermore, the output of feedback NOR gate 126 is coupled to a second input of second NOR gate 124 and to the input of the next one-shot circuit 120b in the chain. The input of the first one-shot circuit 120a in the chain is coupled to the input 128 of control circuit 12.

Thus, one shot circuits 120a-c form a chain of one shot circuits 120a-c, outputs of one shot circuits that are located upstream in the chain being connected successively to one shot circuits that are located downstream in the chain. It should be noted that the stream directions of the chains of shift registers and the one shot circuits are mutually opposite, the shift register stages that are located successively more downstream in the shift register chain being coupled to the outputs of the one-shot circuits that are located successively more upstream in the chain of one shot circuits.

It should be noted that in an integrated circuits the one-shot circuits 120a-c can be laid out in a column of the matrix that contains shift register stages 100a-f in the other columns. The one-shot circuits 120a-c can be provided in a column at the border of the matrix, to one side of all shift register stages 100a-f, as suggested in the figure, but alternatively column of one-shot circuits 120a-c can be provided elsewhere in the matrix, with shift register stages 100a-f on both sides.

In operation data is shifted through the chain of shift register stages 100a-f. Control circuit 12 applies control signals in sequence so that data is shifted from each particular shift register stage 100a-f to the next before data is shifted into the particular shift register stage 100a-f from the preceding shift register stage 100a-f. In the circuit of the figure, this is done in three phases. It is assumed that initially data from final shift register stages 100a,b has been copied or is no longer needed. In the first phase data is copied to the final shift register stages 100a,b from the before final shift register stages 100c,d. In the second phase data is copied to the before final shift register stages 100c,d from the next before final shift register stages 100e,f. In the third phase data is copied to the next before final shift register stages 100e,f. This data may come from an external source (not shown) for example. Thus, at the end of the first and second phase two shift register stages 100a-f out of each three contain mutually independent data and a third of the shift register stages 100a-f contains a copy of data from one of the others.

Control circuit 12 generates control signals to control this form of shifting. In response to a basic control signal, such as a clock signal at its input 128, control circuit 12 generates successive pulses on control lines 14a-c and the hold control inputs of successive groups of shift register stages 100a-f. Each successive pulse is started by setting the latch 121 of a one-shot circuit 120a-c and completed by resetting the latch 121 via feedback NOR gate 126 in a respective one of the on-shot circuits 120a-c.

The pulses are completed only when the voltage at the output of the feedback NOR gate of the one-shot circuit 120a-c has changed sufficiently to enable data transfer between shift register stages 100a-f. The output of the feedback NOR gate has to charge the inherent capacitance of the control lines 14a-c, from the feedback NOR gate to the hold control inputs of the groups of shift register stages 100a-f, and the inherent capacitances of these hold control inputs. As a result the feedback voltage to the second input of the second NOR gate of the one-shot circuit 120a-c will change only gradually, with a delay before it reaches a sufficient level to affect a logic level change at the output of the second NOR gate. Hence the flip-flop of the one-shot circuit 120a-c is reset only when the voltage at the output of its feedback NOR gate has changed sufficiently to enable data transfer between shift register stages 100a-f.

Completion of the pulse from each one-shot circuit 120a-c in control circuit 12 triggers the start of the pulse in the next one-shot circuit 120a-c, if any. Thus, pulses are generated one after the other to control transfer to respective groups of shift register stages 100a-f.

Figure 2:
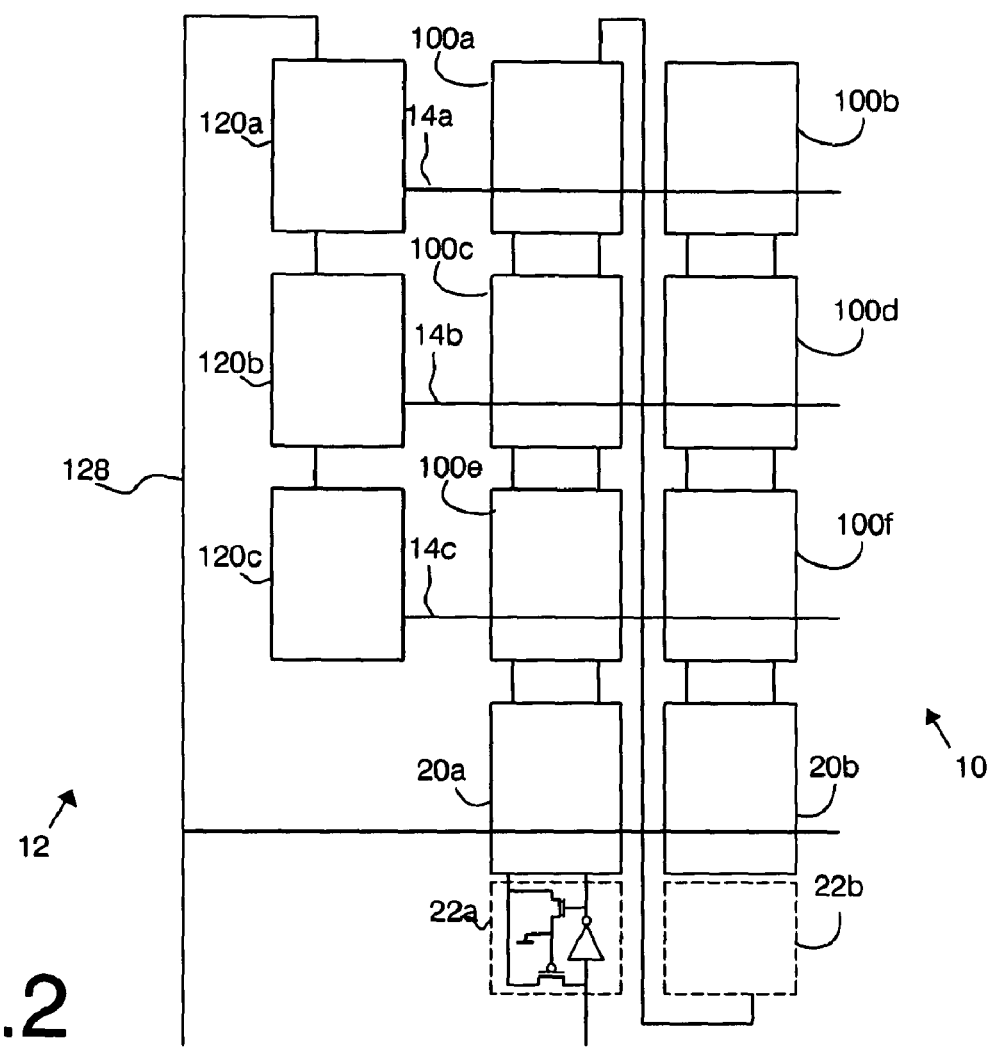
FIG. 2 shows a shift register with sampling stages

FIG. 2 shows a shift register 10 with an added group of sampling stages 20a,b and a group of single-dual rail converter circuits 22a,b with outputs coupled to inputs of sampling stages 20a,b. Sampling stages 20a,b have the same structure as shift register stages 100a-f. As may be noted each sampling stages 20a,b is associated with a sub-chain of shift register stages 100a,c,e, 100b,d,f connected to outputs of the sampling stage 20a,b. By way of example, the input of the single-dual rail converter circuit 22b of one of the sampling stages 20b is shown connected to an output of the sub chain of another sampling stage 20a by a single conductor line. In the sub-chains the inputs of shift register stages 100a-f are fed by dual conductor lines. The hold control inputs of sampling stages 20a,b are controlled by the signal from input 128.

In operation, sampling stages 20a,b are switched between a transparent state and a hold state under control of the signal at input 128. Upon the transition that switches sampling stages 20a,b to the hold stage, the one-shot circuits 120a-c are triggered to generate a succession of pulses. The first pulse in the succession is applied to the shift register stages 100a-f at the end of the sub-chains, the second pulse in the succession is applied to the before last shift register stages 100a-f in the sub-chains and so on until the last pulse in the succession is applied to the shift register stages 100a-f that are connected to sampling stages 20a,b.

In this way data is first sampled in sampling stages 20a,b and subsequently data is advanced one step through their sub-chains. Sampling is performed as fast as possible in response to the transition in the signal at input 128 that signals that the data should be sampled. In this way the design of external circuits that supply data to sampling stages 20a,b (e.g. conventional master slave flip-flops) does not need to take account of delays introduced by control circuit 12.

Sampling is performed as fast as possible because a direct a connection from input 128 to the hold control inputs of sampling circuits is used, without a one-shot circuit. If a one shot circuit would be used, sampling would involve generation of a pulse with an initial edge and a final edge, sampling taking place only at the final edge. By using a connection without a one-shot circuit only one edge is involved, which speeds up sampling.

Figure 2A:
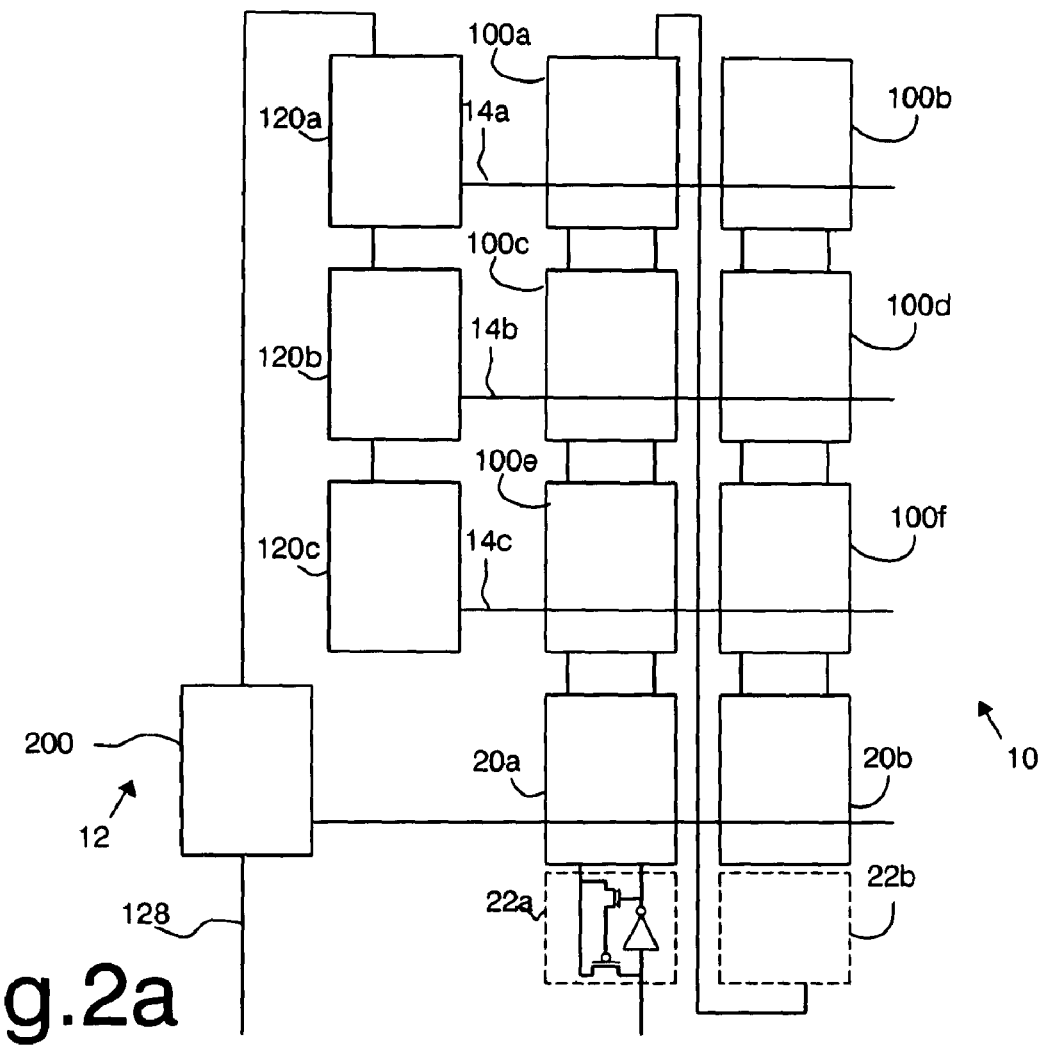
FIG. 2a shows a further shift register

FIG. 2a shows a further embodiment with an additional one-shot circuit 200 similar to the one shot circuits 120a-c in control circuit 12 up front the chain of one shot circuits 120a-c, between input 128 and that chain of one shot circuits 120a-c. In this further embodiment, the control signal of sampling stages 20a,b is provided by the output of the additional one-shot stage 200. This reduces power consumption (because the sampling circuits follow input data less of the time), but it increases the delay between the signal to sample data and the time point at which sampling circuits 20a,b will have captured the data.

Figure 3:
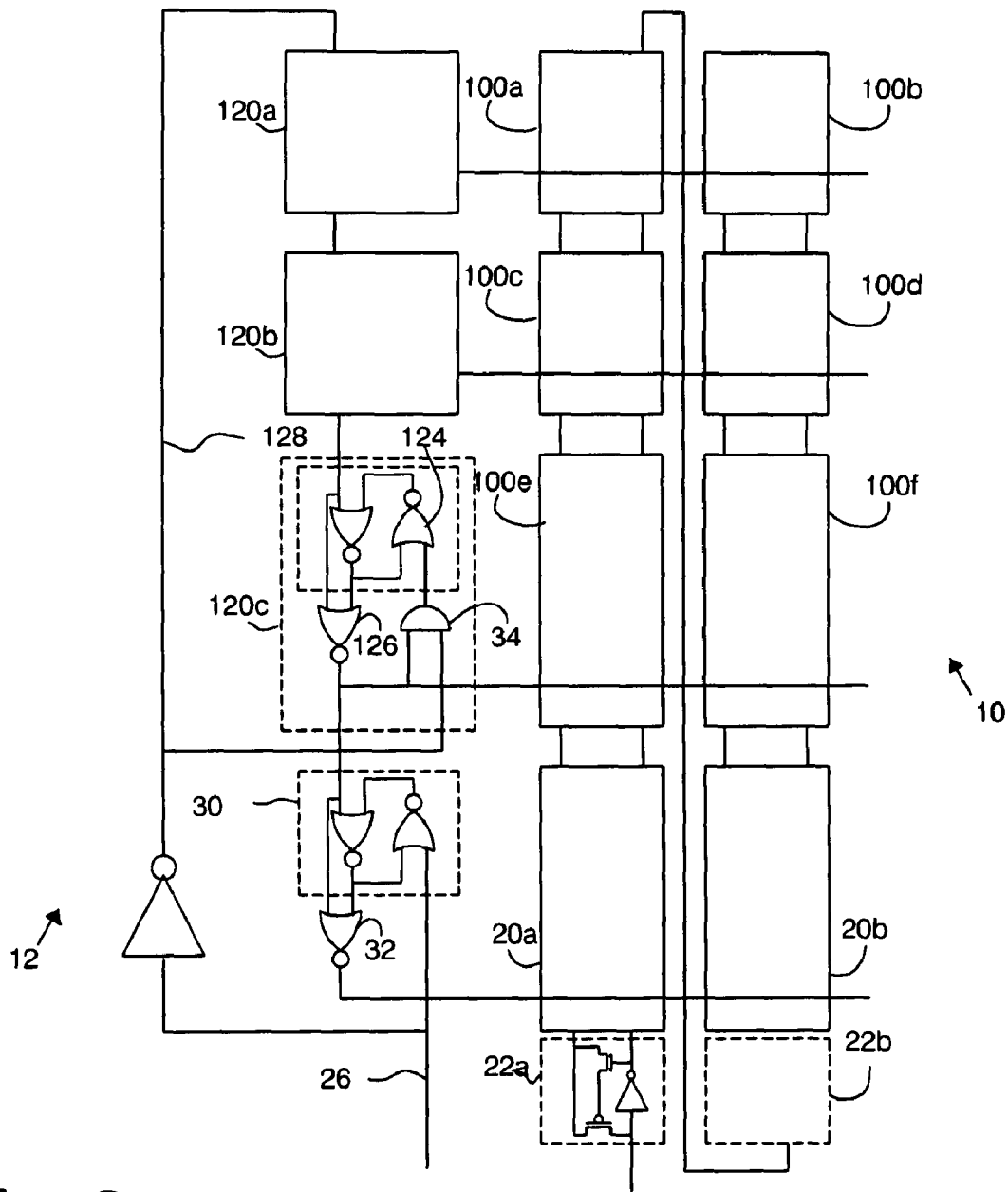
FIG. 3 shows a shift register with a second control circuit

FIG. 3 shows a further embodiment wherein control circuit 12 additionally comprises a further bi-stable circuit 30, a control NOR gate 32 and an AND gate 34. As may be noted further bi-stable circuit 30 and a control NOR gate 32 are configured as the latch 121 and the feedback NOR gates 126 respectively in the one-shot circuits 120a-c, except that the reset input of the further bi-stable circuit 30 is coupled to an inverted control signal input 26 of control circuit 12 and not to the output of a feedback NOR gate.

AND gate 34 has been added instead of the connection from feedback NOR gate 126 to second NOR gate 124 in the one-shot circuit 120c for the shift register stages 100e,f that are connected to sampling stages 20a,b. AND gate 34 has a first input coupled to the input 128 of control circuit 12, a second input coupled to the output of feedback NOR gate 126 and an output coupled to the second input of second NOR gate 124.

In operation the circuit serves to extend the time interval during which sampling circuits 20a,b are kept in the hold state beyond the time indicated by the control signal at inverted control signal input 26. This allocates more time to generate pulses for the shift register stages 100a-f in the sub-chains. In the embodiment of FIG. 2 the pulses are preferably generated while sampling stages 20a,b are kept in the hold state by the control signal at input 128. This limits the speed of the circuit and imposes constraints on the control signal because the sampling stages 20a,b may not be allowed to go back to the transparent state before all pulses have been generated.

In the embodiment of FIG. 3 the transition of the input signal that indicates the hold state is used to reset further bi-stable circuit 30. In the reset state further bi-stable circuit 30 causes sampling stages 20a,b to remain in the hold state until a pulse has arrived through the chain of one-shot circuits 120a-c. AND gate 34 is used to ensure that this pulse does not arrive until the input signal from input 128 of control circuit 12 indicates that the hold state may be ended. Thus, the constraints on the control signal are removed.

Although specific embodiments have been shown, it should be understood that alternatives are possible to realize a similar function. For example, although bi-stable circuits with cross-coupled NOR gates have been shown in the control circuit by way of example, it should be understood that alternatively cross-coupled NAND gates may be used, or more complicated bi-stable circuits with more gates. Use of simple bi-stable circuits has the advantage that the one-shot circuits can be arranged in a matrix layout wherein shift register stages 100a-f are located in rows of the matrix.

As another example, although an application to shift register stages of a specific type has been shown, it should be appreciated that other types of shift register stages may be used e.g. single input stages that do not use dual rail connections or more traditional latch stages (e.g. Flip-flops or other implementations of data latches). However, dual-rail latches have the advantage that they present a very low clock line load and requires only a limited number of transistors. So that a large number of such flip-flops can be used in parallel.

Also it should be appreciated that instead of the straightforward connection between the shift register stages shown in the figures connections comprising logic circuitry may be used, possibly with logic inputs and/or logic outputs coupled to a plurality of the sub-chains.

Figure 4:
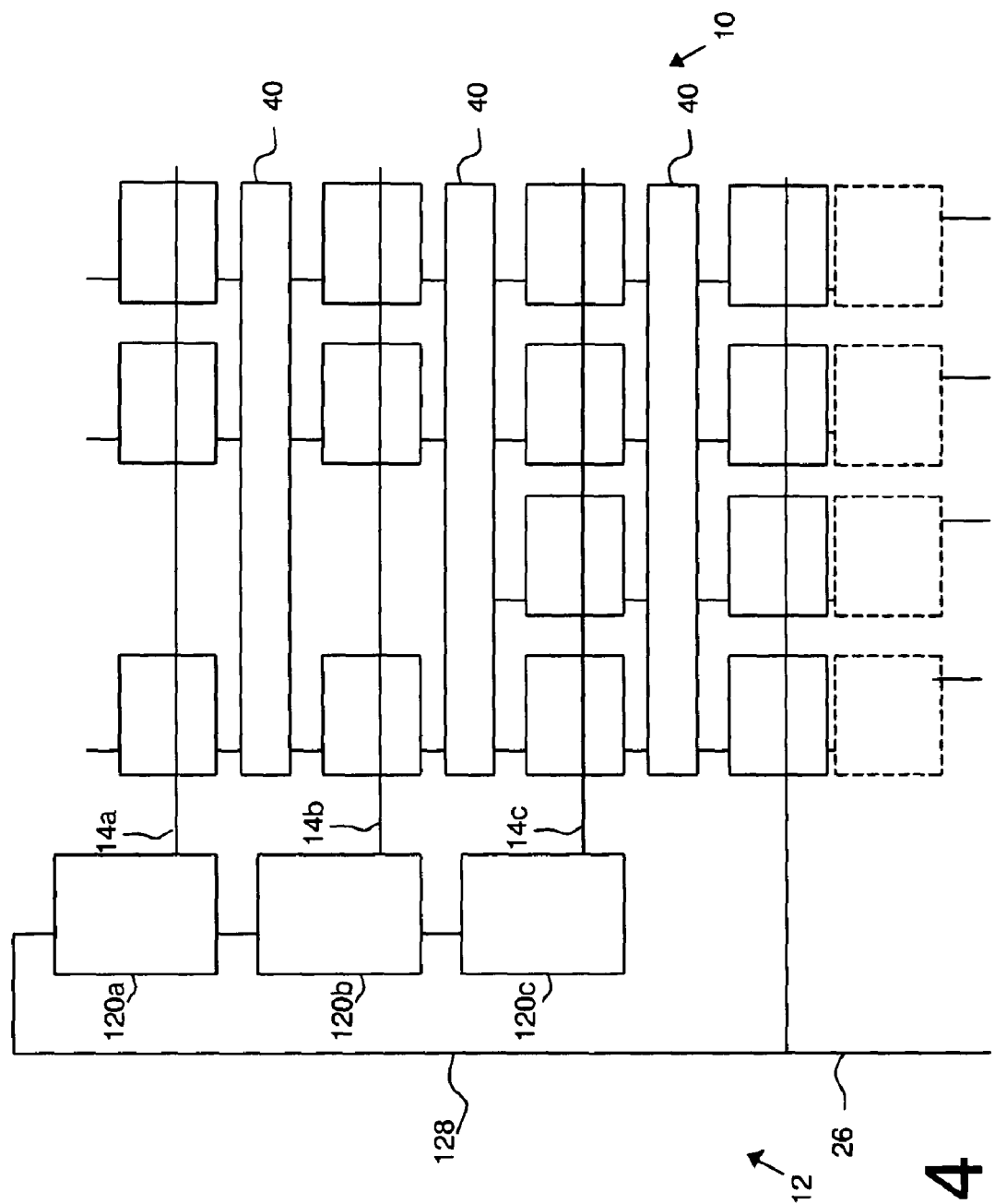
FIG. 4 shows a shift register with includes logic circuits

FIG. 4 shows an example of with added logic stages 40. Logic stages 40 compute output signals as a function of combinations of input signals. Although one stage is shown, it should be appreciated that this stage may be composed of a plurality of logic stages for forming respective output signals from combinations of input signals, and that part of the output signals may simply be copies of input signals. Also logic stages need not be present between all pairs of successive register stages. As may be noted in this case the number of registers in different stages may vary. It may decrease from one stage to another, as shown, or it may increase.

Also it should be appreciated that a set of shift register (sub-) chains is only one example of a set of parallel circuits that require multiphase control signals in parallel. The pulses from control circuit 12 may be applied to other types of functional circuits than shift register (sub-)chains An advantage of using shift register stages with straightforward connections is that they can be incorporated in a matrix layout.

As shown a sub-chain of three shift register stages 100a-f is shown for each sampling stage 20a,b. A larger or smaller number of shift register stages 100a-f may be used, although preferably the number of shift register stages 100a-f in a sub-chain should be kept so low that the sequence of control pulses fits in a period of the signal at input 128. Any number of arrangements of sampling circuits 20a,b and their sub-chains shift can be coupled in series. Alternatively, a plurality of such arrangements can be provided in parallel to shift data in parallel. By using the illustrated control circuit these shift register stages 100a-f can be arranged in a matrix, which provides for a very compact layout.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A circuit comprising
a plurality of functional circuits, each with multiphase control inputs;
a control circuit having a basic control signal input and multiphase control outputs coupled to the multiphase control inputs, the control circuit comprising a chain of one-shot circuits, each comprising a bi-stable circuit, the bi-stable circuit of a first one-shot circuit in the chain having a set input coupled to the basic control signal input, the bi-stable circuits of a remaining or each remaining one-shot circuit in the chain having a set input output of its predecessor in the chain, each bi-stable circuit having an output coupled to a respective one of the multiphase control outputs and a reset input coupled to the respective one of the multiphase control outputs.

2. A circuit according to claim 1, wherein each functional circuit comprises a shift register chain, comprising shift register stages with respective shift control inputs coupled to the respective ones of the multiphase control outputs.

3. A circuit according to claim 1, the circuit comprising a plurality of data sampling circuits with outputs coupled to data inputs of respective ones of the functional circuits, the data sampling circuits having sampling control inputs coupled to the basic control signal input to receive a control signal derived from the basic control signal input without passing through the chain of one-shot circuits.

4. A circuit according to claim 3, wherein each functional circuit comprises a shift register chain comprising a plurality of shift register stages, the shift control inputs of shift register stages that are located successively more downstream in the shift register chain being coupled to the outputs of the one-shot circuits that are located successively more upstream in the chain of one shot circuits.

5. A circuit according to claim 3, wherein the control circuit comprises a further bi-stable circuit with a set input coupled to an output of a final one-shot circuit in the chain of one shot circuits and a reset input coupled to basic control signal input and an output coupled to the sampling control inputs of the data sampling circuits.

6. A circuit according to claim 5, wherein the final one-shot circuit in the chain of one shot circuits comprises a reset circuit configured to reset the bi-stable circuit of the final one-shot circuit upon detection that both a logic level at the multiphase control output from the final one shot circuit has changed to generate a one-shot pulse and the basic control signal has reverted back from a level that has triggered pulses from the chain of one-shot circuits.

7. A circuit according to claim 1, comprising
a plurality of data sampling circuits with outputs coupled to data inputs of respective ones of the functional circuits,
a pulse forming circuit with an input coupled to the basic control signal input and an output coupled to the data sampling circuits.

8. A circuit according to claim 1, wherein the functional circuits each comprise a respective plurality of registers including a first register and a second register, the registers in each functional circuit having respective load control inputs coupled to the respective ones of the multiphase control outputs, the circuit furthermore comprising a logic circuit coupled between outputs of first registers of respective ones of the pluralities of registers and inputs of second registers of respective ones of the pluralities of registers.

* * * * *